(12) United States Patent
Srdanov et al.

(10) Patent No.: US 8,481,104 B2
(45) Date of Patent: Jul. 9, 2013

(54) METHOD OF FORMING ORGANIC ELECTRONIC DEVICES

(75) Inventors: Gordana Srdanov, Santa Barbara, CA (US); Gang Yu, Santa Barbara, CA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 888 days.

(21) Appl. No.: 11/794,604

(22) PCT Filed: Dec. 29, 2005

(86) PCT No.: PCT/US2005/047598
§ 371 (c)(1),
(2), (4) Date: May 28, 2010

(87) PCT Pub. No.: WO2006/072066
PCT Pub. Date: Jul. 6, 2006

(65) Prior Publication Data
US 2010/0233383 A1    Sep. 16, 2010

Related U.S. Application Data

(60) Provisional application No. 60/640,673, filed on Dec. 30, 2004, provisional application No. 60/694,886, filed on Jun. 28, 2005.

(51) Int. Cl.
*B05D 5/12*     (2006.01)
(52) U.S. Cl.
USPC ............. 427/64; 427/74; 427/77; 427/430.1

(58) Field of Classification Search
USPC .................. 427/64, 74, 77, 430.1
See application file for complete search history.

(56) References Cited

U.S. PATENT DOCUMENTS

| | | | |
|---|---|---|---|
| 4,741,976 A | 5/1988 | Eguchi et al. | |
| 5,578,410 A | 11/1996 | Petropoulos et al. | 430/133 |
| 5,633,046 A | 5/1997 | Petropoulos et al. | 427/430.1 |
| 5,681,391 A | 10/1997 | Mistrater et al. | 118/400 |
| 5,693,372 A | 12/1997 | Mistrater et al. | 427/430.1 |
| 6,001,413 A | 12/1999 | Matsuura et al. | |
| 6,303,238 B1 | 10/2001 | Thompson et al. | 428/690 |
| 6,810,814 B2 | 11/2004 | Hasei | 101/485 |
| 7,201,859 B2 | 4/2007 | Lee et al. | |
| 2001/0019782 A1 | 9/2001 | Igarashi et al. | 428/690 |
| 2003/0027051 A1* | 2/2003 | Kejha et al. | 429/233 |
| 2004/0002225 A1 | 1/2004 | Wong et al. | |
| 2004/0029382 A1 | 2/2004 | Kawase | |
| 2004/0101618 A1 | 5/2004 | Ottermann et al. | |
| 2004/0169004 A1 | 9/2004 | Kanbe et al. | |

(Continued)

FOREIGN PATENT DOCUMENTS

| | | |
|---|---|---|
| EP | 0 930 641 A2 | 7/1999 |
| EP | 0989778 | 3/2000 |

(Continued)

OTHER PUBLICATIONS

Gustafsson, G. et al., "Flexible Light-Emitting Diodes made from Soluble Conducting Polymer", *Nature*, 1992, 357, 477-479.

(Continued)

*Primary Examiner* — Brian K Talbot

(57) ABSTRACT

Disclosed are methods of fabricating an organic electronic device, which includes dip coating layers, and the devices made therefrom.

8 Claims, 3 Drawing Sheets

U.S. PATENT DOCUMENTS

| | | |
|---|---|---|
| 2004/0238816 A1 | 12/2004 | Tano et al. |
| 2004/0241451 A1 | 12/2004 | Clark et al. |
| 2008/0290793 A1* | 11/2008 | Takeuchi et al. ............ 313/504 |
| 2010/0026177 A1* | 2/2010 | Saida et al. ................ 313/504 |

FOREIGN PATENT DOCUMENTS

| | | |
|---|---|---|
| EP | 1 011 298 A1 | 6/2000 |
| EP | 1 191 612 A2 | 3/2002 |
| EP | 1 191 614 A2 | 3/2002 |
| EP | 0 880 303 B1 | 1/2004 |
| JP | 61-037883 A | 2/1986 |
| JP | 09-7770 | 1/1997 |
| JP | 01/185353 | 7/2001 |
| KR | 1998-080038 | 11/1998 |
| KR | 2003-0001623 | 1/2003 |
| KR | 2004-0065667 | 7/2004 |
| WO | WO 99/48339 | 9/1999 |
| WO | WO 00/70655 | 11/2000 |
| WO | WO 01/41512 A1 | 6/2001 |
| WO | WO 02/02714 A2 | 1/2002 |
| WO | WO 02/15645 A1 | 2/2002 |
| WO | WO 2004/066477 A2 | 8/2004 |

OTHER PUBLICATIONS

O'Brien, D.F. et al., "Electrophosphoresence from a Doped Polymer Light Emitting Diode", *Synthetic Metals*, 2001, 116(1-3), 379-383.

Campbell, I.H. et al., "Excitation Transfer Processes in a phosphor-doped poly (*p*-phenylene vinylene) Light-Emitting Diode" *Physical Review B*, 65, 085210-1-085210-8.

Othmer, K., *Encyclopedia of Chemical Technology*, 1996, 18 (4$^{th}$ Ed), 837-860.

Braun, D. et al., "Visible Light Emission from Semiconducting Polymer Diodes", *Appl. Phys. Letters*, 1991, 58(18),1982-1984.

Haskal, E.I. et al., Ink-Jet Printing of Passive-Matrix Polymer Light Emitting Devices, *SID International Symposium Digest of Technical Papers*, 2002, 33(11), 776-779.

* cited by examiner

METHOD OF FORMING ORGANIC ELECTRONIC DEVICES

CROSS REFERENCE

This application claims benefit to U.S. Provisional Application Ser. Nos. 60/640,673 filed Dec. 30, 2004 and 60/694,886 filed Jun. 28, 2005, the disclosures of which are each incorporated herein by reference in their entireties.

FIELD

This disclosure relates generally to organic electronic devices, and materials and methods for fabrication of the same.

BACKGROUND

Organic electronic devices convert electrical energy into radiation, detect signals through electronic processes, convert radiation into electrical energy, or include one or more organic semiconductor layers. Most organic electronic devices comprise deposited layers. One area of importance relates to cost-efficient production of organic electronic devices. The advantages of deposition from a liquid medium, such as spin-coating or ink jet printing, are significant.

Thus, what is needed are more liquid deposition methods for making organic electronic devices.

SUMMARY

Electronic organic devices with at least one dip-coated layer are provided, and methods for making the same, as well as devices and sub-assemblies including the same.

The foregoing general description and the following detailed description are exemplary and explanatory only and are not restrictive of the invention, as defined in the appended claims.

DETAILED DESCRIPTION

In one embodiment, electronic organic devices with at least one dip-coated layer are provided. In one embodiment, the layer has a thickness of about 10 nm to about 500 nm, or about 10 nm to about 300 nm, or 80 nm to 150 nm. Dip-coating refers to immersion and withdrawal of a portion of the device ("workpiece"—see definitions section) in a liquid medium. The term "liquid medium" is intended to mean a liquid material, including a pure liquid, a combination of liquids, a solution, a dispersion, a suspension, and an emulsion. Liquid medium is used regardless whether one or more solvents are present. Depending on the desired coating, the liquid medium may contain active material.

The term "active" when referring to a layer or material is intended to mean a layer or material that exhibits electronic or electroradiative properties. An active layer material may emit radiation or exhibit a change in concentration of electron-hole pairs when receiving radiation. The term "active material" refers to a material which electronically facilitates the operation of the device. Examples of active materials include, but are not limited to, materials which conduct, inject, transport, or block a charge, where the charge can be either an electron or a hole. Examples of inactive materials include, but are not limited to, planarization materials, insulating materials, and environmental barrier materials.

The term "photoactive" refers to any material that exhibits electroluminescence, photoluminescence, and/or photosensitivity. In addition, such materials can be buffer materials, charge transport (electron or hole), or electrodes. Mixtures of active materials may also be used.

In one embodiment, a method of depositing an active layer for an organic electronic device is provided, comprising providing a workpiece; and dip-coating the workpiece into a liquid medium comprising active layer material. In one embodiment, the active material is a buffer material. In one embodiment, the workpiece has a buffer layer and the active material is an emissive material. In one embodiment, the liquid medium properties are selected to provide an active layer in a range of about 10 nm to about 500 nm in thickness. In one embodiment, the immersion rate is selected to provide an active layer in a range of about 10 nm to about 500 nm in thickness.

Figure 2:
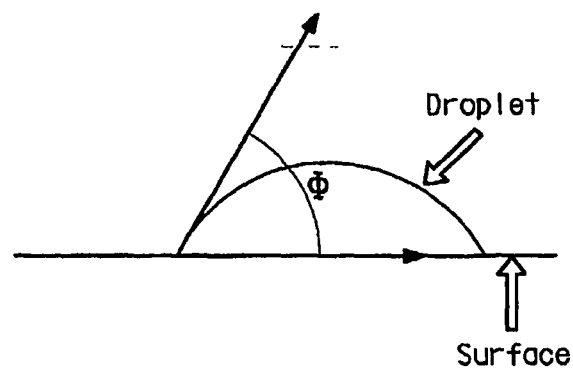
FIG. 2 is a schematic diagram relating to contact angle.

A method of depositing a layer on an organic electronic device, comprising cleaning a substrate so that a surface has a water contact angle of less than 10 degrees; and dip-coating the substrate into a liquid medium. In one embodiment, the substrate that is to be dip-coated is cleaned so that the outer surface has a deionized water ("water") contact angle of less than 10 degrees. As used herein, the term "contact angle" is intended to mean the angle $\Phi$ shown in FIG. 2. For a droplet on a surface, angle $\Phi$ is defined by the intersection of the plane of the surface and a line from the outer edge of the droplet to the surface. Angle $\Phi$ is measured after the droplet has reached an equilibrium position on the surface after being applied, i.e., "static contact angle." A variety of manufacturers make equipment capable of measuring contact angles.

The cleaning may be performed using any surface cleaning technique commonly used in the electronic arts, especially the OLED fabrication arts, as long as the cleaning can yield a surface having the desired water contact angles described herein. In some examples, the cleaning step can be performed by treating the surface with UV ozone. In other examples, $O_2$ plasma treatment can be used. Persons of ordinary skill in the art are familiar with cleaning methodologies which can be used for cleaning in the context of this invention. It is to be understood that cleaning will generally be carried out under conditions and for a time sufficient to result in the desired water contact angle. Selection of such conditions and evaluation of the water contact angles achieved are activities well within the skill levels of the routineer.

In one embodiment, the substrate is cleaned until a water contact angle less than or equal to about 8 degrees is achieved. In one embodiment, the substrate is cleaned until a water contact angle less than or equal to about 5 degrees is achieved.

In one embodiment, the liquid medium has a viscosity of about 1 cP to about 100 cP, about 1 cP to about 50 cP, or about 1 cP to about 20 cP. The workpiece can be dipped into the same liquid more than once to eliminate any imperfections or adjust the thickness of the coated film or layer.

The workpiece may be immersed in the coating liquid for any amount of time, which in some embodiments is between 5 seconds and 30 minutes. The angle and/or the orientation of the workpiece during the dipping process can be adjusted according to well known methods to control the thickness of the deposition.

During the withdrawal from the liquid medium, the workpiece is withdrawn at a rate of about 0.2 mm/min to about 400 mm/min. In one embodiment, the withdrawal rate is about 1 mm/min to about 25 mm/min. Withdrawal of the workpiece is in a range of from about 45 degrees to about 90 degrees relative to the air-liquid surface of the corresponding liquid medium.

In one embodiment, a method for forming a patterned active layer on an organic electronic device is provided, comprising providing a workpiece; treating a portion of the workpiece to make it non-wettable; and dip-coating the workpiece into a liquid medium comprising an active layer material, wherein the active layer material does not deposit on the non-wettable portion, thereby creating a pattern. In one embodiment, the treating is with fluorine containing plasma. In one embodiment, the active layer material is a buffer layer material. In one embodiment, the active layer material is a hole transport layer material. In one embodiment, the active layer material is a photoactive material. In one embodiment, the workpiece is further coated with emissive material. In one embodiment, the resulting active layer has a thickness in the range of from about 10 nm to about 300 nm.

In one embodiment, the properties of the liquid medium are selected to provide an active layer in a range of about 10 nm to about 500 nm in thickness. In one embodiment, the viscosity of the liquid medium is from about 1 cP to about 100 cP, about 1 cP to about 50 cP, or about 1 cP to about 20 cP.

In one embodiment, the withdrawal rate after immersion is selected to provide an active layer in a range of about 10 nm to about 500 nm in thickness. In one embodiment, the withdrawal rate is about 0.2 mm/min to about 400 mm/min, or about 1 mm/min to about 25 mm/min.

The alternative methodologies for contacting the liquid medium to the surface of the workpiece are not limiting for dip coating. The methodologies for bringing the liquid medium into contact with the cleaned workpiece and then separation of the two will require smooth or gentle transitions so as not to disrupt uniform adherence of the liquid medium to the surface. Some examples of the dip coating method and apparatus are disclosed in U.S. Pat. No. 5,693,372, U.S. Pat. No. 5,681,391, U.S. Pat. No. 5,578,410, and U.S. Pat. No. 5,633,046, which are incorporated herein by reference in their entirety.

A second active material can be applied. The second solvent is selected so that it does not deleteriously affect the first layer of first active material. For example, the second solvent cannot substantially dissolve or disperse the first active material. In one embodiment, the first layer can be crosslinked so that it is not dissolved or dispersed in the second solvent. The second liquid medium can be applied by any deposition technique, including liquid deposition, such as further dip-coating or non-liquid deposition, e.g., vapor deposition and thermal transfer. Some other liquid deposition techniques include, but are not limited to, continuous deposition techniques such as spin coating, gravure coating, curtain coating, slot-die coating, spray coating, and continuous nozzle coating; and discontinuous deposition techniques such as ink jet printing, gravure printing, and screen printing. In some embodiments, the second active material is applied by a method selected from spin coating, ink jet printing, and continuous nozzle printing.

Device

Figure 1:
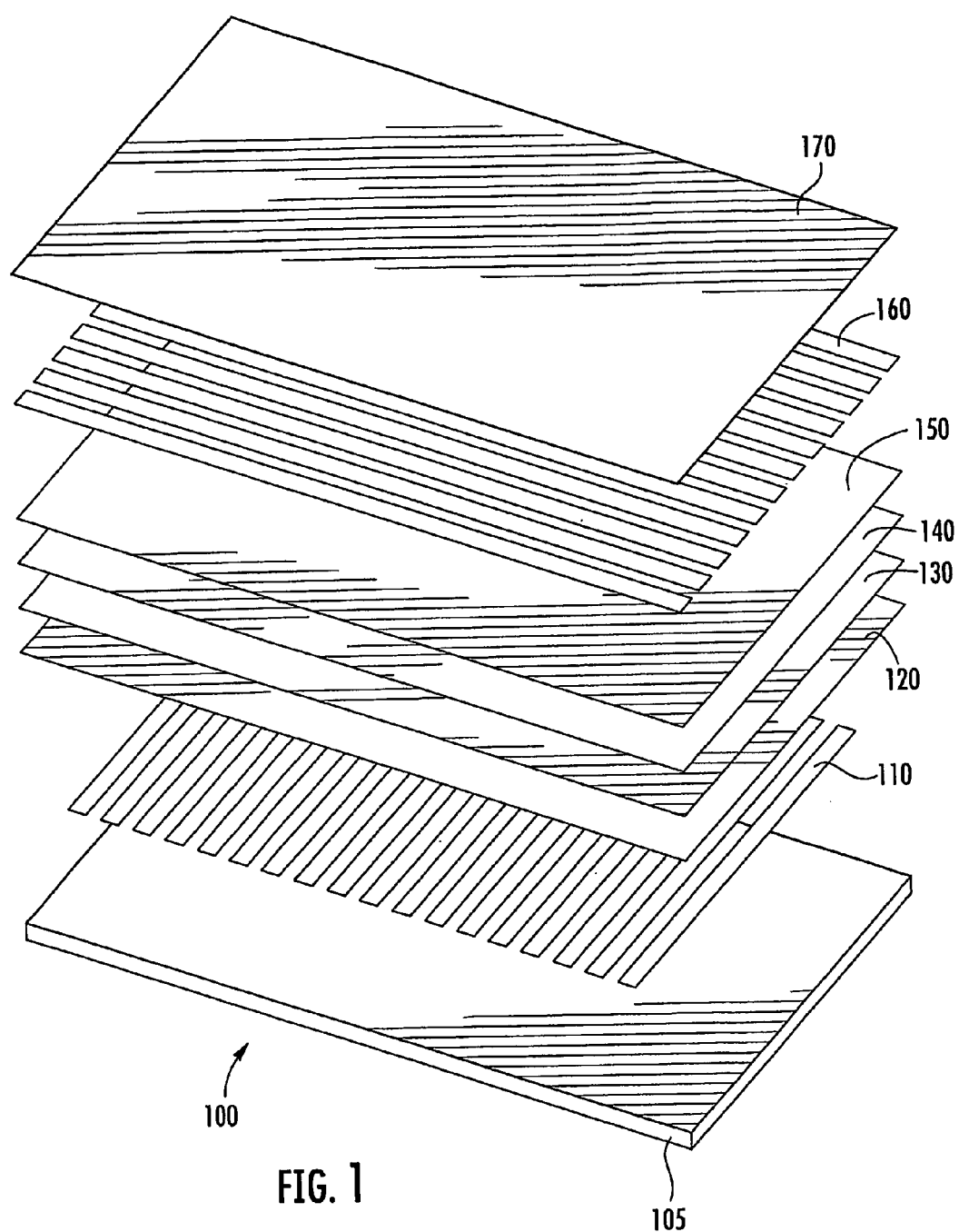
FIG. 1 is a schematic diagram of an organic electronic device.

Referring to FIG. 1, an exemplary organic electronic device 100 is shown. The device 100 includes a substrate 105. The substrate 105 may be rigid or flexible, for example, glass, ceramic, metal, or plastic. When voltage is applied, emitted light is visible through the substrate 105.

A first electrical contact layer 110 is deposited on the substrate 105. For illustrative purposes, the layer 110 is an anode layer. Anode layers may be deposited as lines. The anode can be made of, for example, materials containing or comprising metal, mixed metals, alloy, metal oxides or mixed-metal oxide. The anode may comprise a conducting polymer, polymer blend or polymer mixtures. Suitable metals include the Group 11 metals, the metals in Groups 4, 5, and 6, and the Group 8, 10 transition metals. If the anode is to be light-transmitting, mixed-metal oxides of Groups 12, 13 and 14 metals, such as indium-tin-oxide, are generally used. The anode may also comprise an organic material, especially a conducting polymer such as polyaniline, including exemplary materials as described in *Flexible Light-Emitting Diodes Made From Soluble Conducting Polymer, Nature* 1992, 357, 477-479. At least one of the anode and cathode should be at least partially transparent to allow the generated light to be observed.

An optional buffer layer 120, such as hole transport materials, may be deposited over the anode layer 110, the latter being sometimes referred to as the "hole-injecting contact layer." Examples of hole transport materials suitable for use as the layer 120 have been summarized, for example, in Kirk Othmer, Encyclopedia of Chemical Technology, Vol. 18, 837-860 (4$^{th}$ ed. 1996). Both hole transporting "small" molecules as well as oligomers and polymers may be used. Hole transporting molecules include, but are not limited to: N,N'diphenyl-N,N'-bis(3-methylphenyl)-[1,1'-biphenyl]-4,4'-diamine (TPD), 1,1 bis[(di-4-tolylamino)phenyl]cyclohexane (TAPC), N,N' bis(4-methylphenyl)-N,N'-bis(4-ethylphenyl)-[1,1'-(3,3'-dimethyl)biphenyl]-4,4'-diamine (ETPD), tetrakis(3-methylphenyl)-N,N,N',N'-2,5-phenylenediamine (PDA), a-phenyl 4-N,N-diphenylaminostyrene (TPS), p (diethylamino)benzaldehyde diphenylhydrazone (DEH), triphenylamine (TPA), bis[4(N,N-diethylamino)-2-methylphenyl](4-methylphenyl)methane (MPMP), 1 phenyl-3-[p-(diethylamino)styryl]-5-[p-(diethylamino)phenyl]pyrazoline (PPR or DEASP), 1,2 trans-bis (9H-carbazol-9-yl)cyclobutane (DCZB), N,N,N',N'tetrakis (4-methylphenyl)-(1,1'-biphenyl)-4,4'-diamine (TTB), and porphyrinic compounds, such as copper phthalocyanine. Useful hole transporting polymers include, but are not limited to, polyvinylcarbazole, (phenylmethyl)polysilane, and polyaniline. Conducting polymers are useful as a class. It is also possible to obtain hole transporting polymers by doping hole transporting moieties, such as those mentioned above, into polymers such as polystyrenes and polycarbonates.

An organic layer 130 may be deposited over the buffer layer 120 when present, or over the first electrical contact layer 110. In some embodiments, the organic layer 130 may be a number of discrete layers comprising a variety of components. Depending upon the application of the device, the organic layer 130 can be a light-emitting layer that is activated by an applied voltage (such as in a light-emitting diode or light-emitting electrochemical cell), or a layer of material that responds to radiant energy and generates a signal with or without an applied bias voltage (such as in a photodetector).

Other layers in the device can be made of any materials which are known to be useful in such layers upon consideration of the function to be served by such layers.

Any organic electroluminescent ("EL") material can be used as a photoactive material (e.g., in layer 130). Such materials include, but are not limited to, fluorescent dyes, small molecule organic fluorescent compounds, fluorescent and phosphorescent metal complexes, conjugated polymers, and mixtures thereof. Examples of fluorescent dyes include, but are not limited to, pyrene, perylene, rubrene, derivatives thereof, and mixtures thereof. Examples of metal complexes include, but are not limited to, metal chelated oxinoid compounds, such as tris(8-hydroxyquinolato)aluminum (Alq3); cyclometalated iridium and platinum electroluminescent compounds, such as complexes of Iridium with phenylpyridine, phenylquinoline, or phenylpyrimidine ligands as disclosed in Petrov et al., Published PCT Application WO 02/02714, and organometallic complexes described in, for example, published applications US 2001/0019782, EP 1191612, WO 02/15645, and EP 1191614; and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

In one embodiment of the devices of the invention, photoactive material can be an organometallic complex. In another embodiment, the photoactive material is a cyclometalated complex of iridium or platinum. Other useful photoactive materials may be employed as well. Complexes of iridium with phenylpyridine, phenylquinoline, or phenylpyrimidine ligands have been disclosed as electroluminescent compounds in Petrov et al., Published PCT Application WO 02/02714. Other organometallic complexes have been described in, for example, published applications US 2001/0019782, EP 1191612, WO 02/15645, and EP 1191614. Electroluminescent devices with an active layer of polyvinyl carbazole (PVK) doped with metallic complexes of iridium have been described by Burrows and Thompson in published PCT applications WO 00/70655 and WO 01/41512. Electroluminescent emissive layers comprising a charge carrying host material and a phosphorescent platinum complex have been described by Thompson et al., in U.S. Pat. No. 6,303,238, Bradley et al., in *Synth. Met.* 2001, 116 (1-3), 379-383, and Campbell et al., in Phys. Rev. B, Vol. 65 085210.

A second electrical contact layer 160 is deposited on the organic layer 130. For illustrative purposes, the layer 160 is a cathode layer.

Cathode layers may be deposited as lines or as a film. The cathode can be any metal or nonmetal having a lower work function than the anode. Exemplary materials for the cathode can include alkali metals, especially lithium, the Group 2 (alkaline earth) metals, the Group 12 metals, including the rare earth elements and lanthanides, and the actinides. Materials such as aluminum, indium, calcium, barium, samarium and magnesium, as well as combinations, can be used. Lithium-containing and other compounds, such as LiF and $Li_2O$, may also be deposited between an organic layer and the cathode layer to lower the operating voltage of the system.

An electron transport layer 140 or electron injection layer 150 is optionally disposed adjacent to the cathode, the cathode being sometimes referred to as the "electron-injecting contact layer."

An encapsulation layer 170 is deposited over the contact layer 160 to prevent entry of undesirable components, such as water and oxygen, into the device 100. Such components can have a deleterious effect on the organic layer 130. In one embodiment, the encapsulation layer 170 is a barrier layer or film.

Though not depicted, it is understood that the device 100 may comprise additional layers. For example, there can be a layer (not shown) between the anode 110 and hole transport layer 120 to facilitate positive charge transport and/or bandgap matching of the layers, or to function as a protective layer. Other layers that are known in the art or otherwise may be used. In addition, any of the above-described layers may comprise two or more sub-layers or may form a laminar structure. Alternatively, some or all of anode layer 110 the hole transport layer 120, the electron transport layers 140 and 150, cathode layer 160, and other layers may be treated, especially surface treated, to increase charge carrier transport efficiency or other physical properties of the devices. The choice of materials for each of the component layers is preferably determined by balancing the goals of providing a device with high device efficiency with device operational lifetime considerations, fabrication time and complexity factors and other considerations appreciated by persons skilled in the art. It will be appreciated that determining optimal components, component configurations, and compositional identities would be routine to those of ordinary skill of in the art.

In one embodiment, the different layers have the following range of thicknesses: anode 110, 500-5000 Å, in one embodiment 1000-2000 Å; hole transport layer 120, 50-2000 Å, in one embodiment 200-1000 Å; photoactive layer 130, 10-2000 Å, in one embodiment 100-1000 Å; layers 140 and 150, 50-2000 Å, in one embodiment 100-1000 Å; cathode 160, 200-10000 Å, in one embodiment 300-5000 Å. The location of the electron-hole recombination zone in the device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

In operation, a voltage from an appropriate power supply (not depicted) is applied to the device 100. Current therefore passes across the layers of the device 100. Electrons enter the organic polymer layer, releasing photons. In some OLEDs, called active matrix OLED displays, individual deposits of photoactive organic films may be independently excited by the passage of current, leading to individual pixels of light emission. In some OLEDs, called passive matrix OLED displays, deposits of photoactive organic films may be excited by rows and columns of electrical contact layers.

Devices can be prepared employing a variety of techniques. These include, by way of non-limiting exemplification, vapor deposition techniques and liquid deposition. Devices may also be sub-assembled into separate articles of manufacture that can then be combined to form the device.

DEFINITIONS

The use of "a" or "an" are employed to describe elements and components of the invention. This is done merely for convenience and to give a general sense of the invention. This description should be read to include one or at least one and the singular also includes the plural unless it is obvious that it is meant otherwise.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

The term "layer" is used interchangeably with the term "film" and refers to a coating covering a desired area. The area can be as large as an entire device or a specific functional area such as the actual visual display, or as small as a single sub-pixel. Films can be formed by any conventional deposition technique, including vapor deposition and liquid deposition. Liquid deposition techniques include, but are not limited to, continuous deposition techniques such as spin coating, gravure coating, curtain coating, dip coating, slot-die coating, spray-coating, and continuous nozzle coating; and discontinuous deposition techniques such as ink jet printing, gravure printing, and screen printing.

The term "organic electronic device" is intended to mean a device including one or more semiconductor layers or materials. Organic electronic devices include, but are not limited to: (1) devices that convert electrical energy into radiation (e.g., a light-emitting diode, light emitting diode display, diode laser, or lighting panel), (2) devices that detect signals through electronic processes (e.g., photodetectors photoconductive cells, photoresistors, photoswitches, phototransistors, phototubes, infrared ("IR") detectors, or biosensors), (3) devices that convert radiation into electrical energy (e.g., a photovoltaic device or solar cell), and (4) devices that include one or more electronic components that include one or more organic semiconductor layers (e.g., a transistor or diode). The term device also includes coating materials for memory storage devices, antistatic films, biosensors, electrochromic devices, solid electrolyte capacitors, energy storage devices such as a rechargeable battery, and electromagnetic shielding applications.

The term "substrate" is intended to mean a base material that can be either rigid or flexible and may be include one or more layers of one or more materials, which can include, but are not limited to, glass, polymer, metal or ceramic materials or combinations thereof. The reference point for a substrate is the beginning point of a process sequence. The substrate may or may not include electronic components, circuits, or conductive members.

The term "workpiece" is intended to mean a substrate at any particular point of a process sequence. Note that the substrate may not significantly change during a process sequence, whereas the workpiece significantly changes during the process sequence. For example, at a beginning of a process sequence, the substrate and workpiece are the same. After a layer is formed over the substrate, the substrate has not technically changed, but now the workpiece includes the substrate and the layer.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

EXAMPLES

The concepts described herein will be further described in the following examples, which do not limit the scope of the invention described in the claims.

Example 1

This example illustrates the effect of a dip-coated layer on various device characteristics such as current, luminance, and device efficiency.

An OLED having the structure: glass/ITO (anode)/buffer layer/light emitting layer/Ba/Al (cathode) was built using the dip coating process (see TABLE 1). The buffer layer contained PEDOT (Baytron-P, CH 8000 from Bayer) and the light emitting layer contained a PPV derivative (PDY-132, SY20-007-021 from Covion). The size of the substrate was 30 mm×30 mm with an active area size of 20 mm×15 mm.

Four devices were made using various combinations of spin coating and dip coating of the buffer layer and the light emitting layer. The four devices are referred to as Samples 1-4 in TABLE 1.

TABLE 1

| Sample | Buffer Layer | Light Emitting Layer |
|---|---|---|
| 1 | spin coating at 1000 rpm | spin coating at 1800 rpm |
| 2 | dip coating at 10 mm/min | spin coating at 1800 rpm |
| 3 | spin coating at 1000 rpm | dip coating at 20 mm/min |
| 4 | dip coating at 10 mm/min | dip coating at 20 mm/min |

Data in TABLE 1 was collected using a single coat of buffer layer and a single coat of the light emitting layer. The workpiece was pulled out of the solutions at approximately 90-degrees with respect to the surface of the solution (i.e., vertically perpendicular).

Aqueous buffer layer solution was filtered through a 0.45-micron filter after each pass in order to keep it free of particles. The light emitting layer solution in organic solvent was also filtered through a 0.45-micron filter.

The workpiece was immersed into each dip coating solution for a period between about 5-30 seconds before being withdrawn. After applying the first layer, the buffer layer, to a thickness of about 100 nm to 120 nm, as measured by the Dektak surface profilometer, the workpiece was baked on a hot plate at 200° C. for about five minutes.

Alternatively, the workpiece may be baked in vacuum at 90° C. for about 30 minutes.

The light emitting layer was applied to a thickness of 65 nm to 76 nm and baked at 180° C. for about 10 minutes.

Each of the buffer layer and the light emitting layer can be dip coated more than once to achieve the desired layer or correct a surface defect, as needed. Typically, the layer thickness increased 30% to 70% for each dip.

Figure 3:
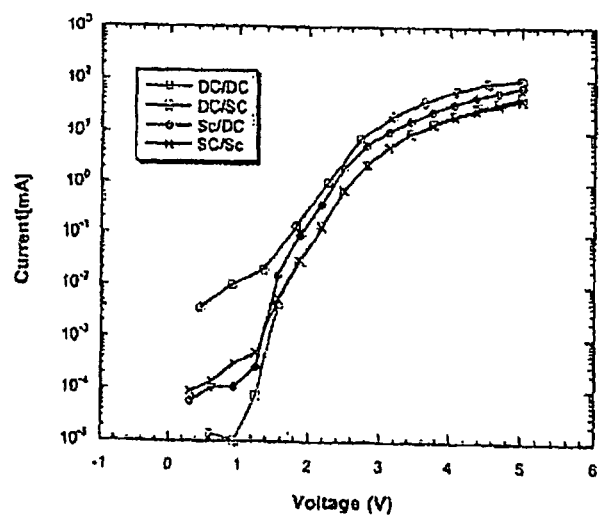
FIG. 3 is an I-V plot of a dip-coated device.

FIG. 3 is an I-V plot of the sample device current level as a function of voltage that was applied to the electrodes. As shown in the Figure, voltages ranging from 0.2 V to 5.0 V were applied to each of the Samples. Current level variations among the Samples were large at voltage range below 1.5 V, but not more than about 75 mA at voltage range above 2 V. Sample 4 showed a current level that is somewhat higher than the current level of other samples. Without being bound to a theory, this higher current level could be due to the dip coated layers being thinner than the spin coated layers. Overall, the current levels of the four samples were within a reasonable range of each other, indicating comparable performance from the perspective of current leakage.

Figure 4:
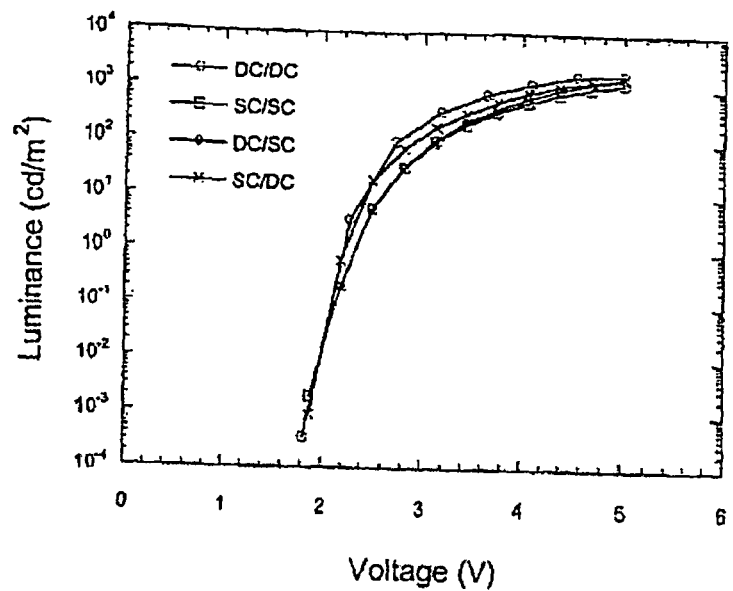
FIG. 4 is a plot of luminance versus voltage for a dip-coated device.

FIG. 4 is a plot of the sample devices' luminance level as a function of voltage. At least in the voltage range of about 1.8 V to 5.0 V, the variation in the luminance level of the sample devices were about 75 cd/m² or less. However, generally, Sample 4 showed the highest luminance level within this narrow range of variation.

TABLE 2 summarizes the current and device efficiency values of the four samples at a voltage of around 3 V and at Luminance of 200 cd/m². The "device efficiency" is the ratio of light emitted per unit area to current per unit area [cd/A]. The data indicates that device efficiency is the best when both the buffer layer and the light emitting layer are dip-coated, since the fewest number of charge carriers is needed to generate a photon. Spin-coating the light emitting layer while dip coating the buffer layer resulted in the worst efficiency, requiring, on the average, more than seven charge carriers to generate a photon.

TABLE 2

| Sample | Voltage | Current [mA/cm²] | Device Efficiency [cd/A] |
|---|---|---|---|
| 1 | 3.4 | 3.0 | 6.7 |
| 2 | 3.1 | 4.8 | 5.9 |
| 3 | 3.4 | 4.5 | 7.3 |
| 4 | 2.9 | 2.5 | 5.1 |

The data in TABLE 2 suggests that comparable device efficiency is achieved by dip coating and spin coating. Although the substrate size for this experiment was only 30 mm×30 mm, scaling up the substrate size to Gen-5 or Gen-6 size should not affect the Sample trends significantly.

Example 2

This example illustrates a method of making a full color electroluminescent display using dip coating. A cleaned substrate is dipped into a container of liquid material. In one embodiment, the liquid medium is buffer material. PEDOT Baytron-P, CH8000 from Bayer may be used as the buffer material. The buffer-coated workpiece is then dip-coated in a blue light emitting polymer, such as Covion polyspiro CB02LO2 006002 (stage 330). Subsequently, the red pixels are ink-jetted on by drop deposition or continuous line deposition of spyro-polyfluorene red emitter from Covion (0.05-0.15 wt. % in cosolvents of anisole:o-xylene:3,4-DMA) on the blue layer. This drop deposition or line deposition may be done using single nozzle or multi-nozzle inkjet machine. The thickness of the red layer is about 10 nm to 30 nm. After the red light emitting layer dries, a green light emitting layer is ink-jetted on the red polymer layer with corresponding polymer solutions. The green material may be, for example, DOW Green-K2 from Dow Chemical Co. The coated workpiece is then baked at 120° C. for about 10 minutes. After baking, a cathode is deposited. In an alternative process, the green and red polymer layers are formed before the unpatterned blue polymer is deposited by dip coating. Also, the ink-jetting process for the green and red pixels may be replaced by laser thermal transfer or by thermal diffusion to a defined zone. Optionally, portions of the blue layer may be removed, so that there is no blue layer where the red layer and the green layer are deposited. The blue layer may be removed by time-controlled O2 plasma etching.

Example 3

This example illustrates a second OLED manufacturing process for making a full color electroluminescent display using dip coating. This process is similar to the process of Example 2, with the main difference being that the green emitter is ink-jetted on before the red emitter. Thus, after dip coating the blue light emitting polymer in the manner described in Example 2, the blue-coated workpiece is ink-jetted with a green light emitting material (e.g., DOW Green-K2 from Dow Chemical Co.). When the green material is dried, the red layer (e.g., the Covion mixture of Example 2) is ink-jetted on, and then baked at 120° C. for about 10 minutes.

Example 4

This example demonstrates that dip coating can be used to fabricate high quality, large size displays with high image quality. An active matrix amorphous silica of approximately 102 mm×102 mm (4-inch diagonal) and QVGA (320×RGB× 240 pixels with total pixel count greater than 2.3×105) was obtained. One of the structures from TABLE 1 (dip coating/ spin coating) was chosen, which has a buffer layer thickness of about 100 nm and a light emitting layer thickness of about 80 nm.

Figure 5:
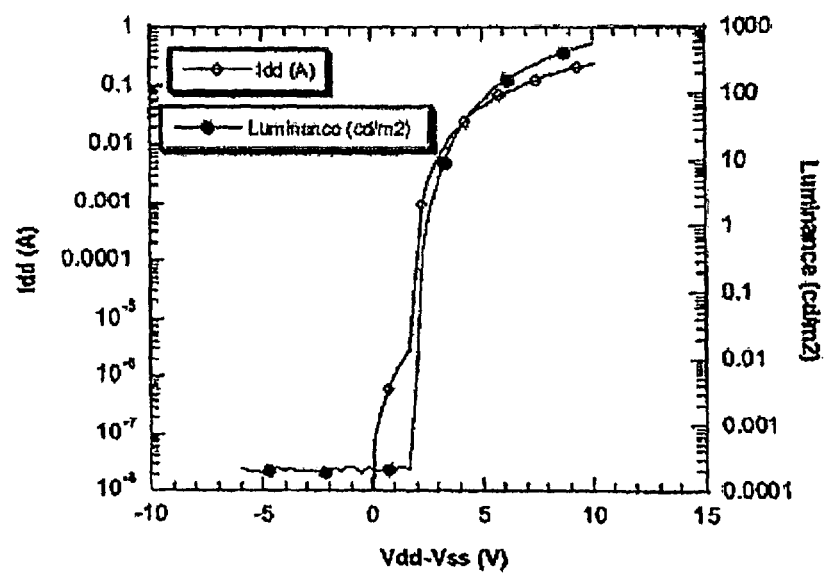
FIG. 5 is an I-V plot of another dip-coated device.

This structure demonstrated an electroluminescence efficiency of about 11.2 cd/A and power efficiency of about 4.5 lm/Watt at 200 cd/m2. This display shows homogeneity over the entire active area with high image quality. The I-V characteristics are shown in FIG. 5.

Example 5

Treatment of a photoresist structure on a substrate, for example a Capon Rev2 substrate, with a fluorine containing plasma makes the treated portions of the structure non-wetting.

Plasma can be produced using a March PX500 model plasma generator by March Plasma Systems (Concord, Calif.). The equipment is configured in flow through mode with a perforated, grounded plate and a floating substrate plate. A 6-inch floating substrate plate is treated with a plasma formed from a $CF_4/O_2$ gas composition. The gas composition may include about 80% to about 100% $CF_4$, or about 92% $CF_4$, and about 0% to about 20% $O_2$, or about 8% $O_2$ by volume. The substrate may be exposed for about 2 min to about 5 min, or about 3 min, at a pressure of about 300 mTorr to about 600 mTorr, or about 400 mTorr, using about 200 W to about 500 W plasma, or about 400 W plasma.

The workpiece is then dip coated in buffer layer. After appropriate drying, the workpiece is then dip coated in hole transport layer. The treated non-wetting parts of the structure are not coated, and retain their non-wetting characteristics, which can be utilized in the printing of RGB (red, green, blue) emissive layers. For example, a MicroFab ink jet printer with a 30 um ink jet tip can be used to give a 37 pL drop with 1% Dow K2 green light emitting polymer in 3,4 dimethyl anisole. Fabrication is completed by adding a cathode and encapsulating the workpiece to form an organic electronic device.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

Many aspects and embodiments have been described above and are merely exemplary and not limiting. After reading this specification, skilled artisans appreciate that other aspects and embodiments are possible without departing from the scope of the invention.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges include each and every value within that range.

What is claimed:

1. A method of depositing a buffer layer and a light emitting layer for an organic electronic device, comprising:
    cleaning a workpiece until a water contact angle of a surface of the workpiece is less than 10 degrees;
    dip-coating the cleaned workpiece into a liquid medium comprising a buffer layer material, wherein the viscosity of the liquid medium is from about 1 cP to about 20 cP;
    drying the workpiece and;
    dip-coating the buffer-coated workpiece into a liquid medium comprising a light emitting layer material, wherein the viscosity of the liquid medium is from about 1 cP to about 20 cP,
    wherein the buffer layer and light emitting layer each have a thickness in the range of from about 10 nm to about 300 nm.

2. The method of claim 1, wherein the dip-coating of the workpiece into each liquid medium comprises selecting a withdrawal rate to provide the buffer layer and light emitting layer in a range of about 10 nm to about 300 nm in thickness.

3. The method of claim 2, wherein the withdrawal rate is about 0.2 mm/min to about 400 mm/min, or about 1 mm/min to about 25 mm/min.

4. The method of claim 1, wherein the workpiece is cleaned until a water contact angle is less than or equal to about 8 degrees, or wherein the substrate is cleaned until a water contact angle is less than or equal to about 5 degrees.

5. The method of claim 1, further comprising: treating a portion of the workpiece to make it non-wettable wherein the buffer layer and light emitting layer material does not deposit on the non-wettable portion, thereby creating a pattern.

6. The method of claim 5, wherein the treating is with fluorine containing plasma.

7. The method of claim 5, wherein the dip-coating of the workpiece into each liquid medium comprises selecting a withdrawal rate to provide the buffer layer and light emitting layer in a range of about 10 nm to about 300 nm in thickness.

8. The method of claim 7, wherein the withdrawal rate is about 0.2 mm/min to about 400 mm/min, or about 1 mm/min to about 25 mm/min.

* * * * *